(12) United States Patent
Ebert et al.

(10) Patent No.: US 6,816,814 B2
(45) Date of Patent: *Nov. 9, 2004

(54) METHOD AND APPARATUS FOR DECOMPOSING AND VERIFYING CONFIGURABLE HARDWARE

(75) Inventors: Jeffrey Allen Ebert, Half Moon Bay, CA (US); Ravi Venugopalan, Santa Clara, CA (US); Scott Carlton Evans, Santa Clara, CA (US)

(73) Assignee: Sonics, Inc., Mountain View, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 10/293,734

(22) Filed: Nov. 12, 2002

(65) Prior Publication Data

US 2004/0093186 A1 May 13, 2004

(51) Int. Cl.$^7$ ................................................ G06F 11/30
(52) U.S. Cl. .................. 702/182; 702/57; 702/85; 702/123; 714/733; 714/738; 716/4; 716/5; 716/7; 716/12; 703/23; 324/763; 324/765
(58) Field of Search ................. 702/57–59, 85, 702/117–123, 182, 189; 714/733, 738; 716/4, 5, 7, 12; 703/23, 25; 324/763, 765

(56) References Cited

U.S. PATENT DOCUMENTS

| | | | |
|---|---|---|---|
| 5,801,956 A | * | 9/1998 | Kawamura et al. ............ 716/4 |
| 2002/0091979 A1 | * | 7/2002 | Cooke et al. ................ 714/733 |
| 2002/0161568 A1 | * | 10/2002 | Sample et al. ................ 703/25 |
| 2002/0171449 A1 | * | 11/2002 | Shimizu et al. ............. 324/765 |
| 2003/0067319 A1 | * | 4/2003 | Cho .......................... 324/765 |

OTHER PUBLICATIONS

ALDEC, 'What is TCL/TK Scrpting', , Jan. 2002, ALDEC Support, pp. 1–9.*
Thaker et al., 'Register–Transfer Level Fault Modeling and Testing Evaluation Techniques for VLSI Circuits', Jan. 2000, IEEE Publication, pp. 940–949.*
Lin et al., 'A Functional Test Planning System for Validation of DSP Circuits Modeled in VHDL', Mar. 1998, IEEE Publication, pp. 172–177.*
Evans et al, *Honey I Shrunk the SOC Verification Problem*, Sonics Inc., SNUG San Jose 2001, 11 pages.
Thaker et al., "Register–Transfer Level Fault Modeling and Test Evaluation Techniques for VLSI Circuits", ITC International Test Conference, 2000 IEEE, Paper 35.3, pp. 940–949.
VSI Alliance reference, "An overview of VSIA" from http://www.vsi.org/aboutVSIA/index.htm, 2004.
Lin et al., "A Functional Test Planning System for Validation of DSP Circuits Modeled in VHDL", 1998 International Verilog, pp. 172–177.

* cited by examiner

*Primary Examiner*—Marc S. Hoff
*Assistant Examiner*—Elias Desta
(74) *Attorney, Agent, or Firm*—Blakely, Sokoloff, Taylor & Zafman LLP

(57) ABSTRACT

The present invention includes a method and apparatus for decomposing and verifying configurable hardware. In one embodiment, the method includes automatically decomposing a hardware system into a set of one or more units, creating a test-bench for each of the set of units, and verifying each of the set of units before verifying the hardware system design.

39 Claims, 7 Drawing Sheets

METHOD AND APPARATUS FOR DECOMPOSING AND VERIFYING CONFIGURABLE HARDWARE

FIELD OF THE INVENTION

The present invention pertains to hardware verification. More particularly, the present invention relates to verifying configurable hardware.

BACKGROUND OF THE INVENTION

"Configurable hardware" or "parameterized hardware" describes hardware systems that are customized automatically at design creation time by using specified values for a set of parameters or attributes. Such hardware may also support changes at run-time depending on parameter settings. Configurable hardware systems typically provide better performance than software running on a general-purpose computer system and greater flexibility than conventional application specific integrated circuits (ASICs) without increasing circuit size and cost.

In conventional hardware systems, it is necessary to verify a system's functionality by testing the system and its components. Typically, the complexity of verifying a system's functionality increases with the number of components that make up the system. Therefore, the conventional approach is to manually verify each unit individually and then to assemble the "known good units" into a system. If hardware is hierarchically arranged, verification must be performed for each level in the hierarchy. If each individual unit has been verified before assembling the system, verifying system functionality can focus on potential problem with interactions between components rather than on each component's capabilities.

Configurable hardware systems can be verified using this type of convention hierarchical decomposition. However, because each instance of a configurable hardware system is different, each time a configuration parameter is modified, the system and its components must be manually verified. The cost of repeatedly manually verifying a system and its components often offsets the advantages of configurable hardware.

SUMMARY OF THE INVENTION

The present invention includes a method and apparatus for decomposing and verifying configurable hardware. In one embodiment, the method includes automatically decomposing a hardware system into a set of one or more units, creating a test-bench for each of the set of units, and verifying each of the set of units before verifying the hardware system design.

BRIEF DESCRIPTION OF THE DRAWINGS

The present invention is illustrated by way of example and not limitation in the Figures of the accompanying drawings, in which like references indicate similar elements and in which.

DETAILED DESCRIPTION

A method and apparatus for decomposing and verifying configurable hardware are described. Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those skilled in the art. Thus, the present invention can include any variety of combinations and/or integrations of the embodiments described herein.

Herein, block diagrams illustrate exemplary embodiments of the invention. Also herein, flow diagrams illustrate operations of the exemplary embodiments of the invention. The operations of the flow diagrams will be described with reference to the exemplary embodiments shown in the block diagrams. However, it should be understood that the operations of the flow diagrams could be performed by embodiments of the invention other than those discussed with reference to the block diagrams, and embodiments discussed with references to the block diagrams could perform operations different than those discussed with reference to the flow diagrams.

Overview

In one embodiment of the invention, a generation and verification unit generates a configurable hardware system based on configuration data and a configurable hardware library. The configurable hardware system is made up of a number of units. In one embodiment of the invention, the generation and verification unit hierarchically decomposes a configurable hardware system into units that make up the system design. Configuration data is applied to each unit so that it can be removed and verified or analyzed outside of the system without changing the unit itself. The generation and verification unit creates a test-bench, tests, and controlling scripts for each unit.

Exemplary Architecture

Figure 1:
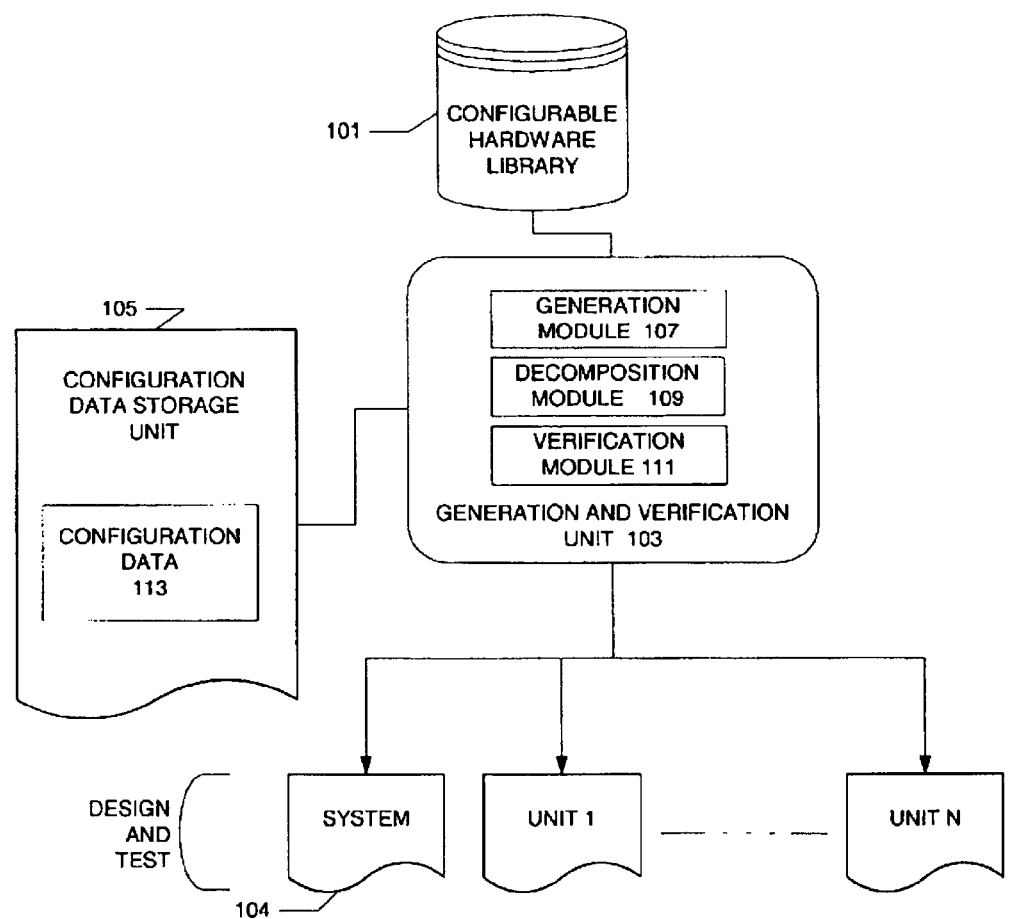
FIG. 1 is a block diagram for decomposing and verifying configurable hardware according to one embodiment of the invention.

FIG. 1 is a block diagram for decomposing and verifying configurable hardware according to one embodiment of the invention. FIG. 1 includes a generation and verification unit 103, which further includes a generation module 107, decomposition module 109, and verification module 111. The generation and verification unit 103 is connected to a configurable hardware library 101, and a configuration data storage unit 105. The configuration data storage unit 105 includes configuration data 113. The generation and verification unit 103 generates a configurable hardware system 104 and its constituent units (illustrated as units 1–N).

In a configurable hardware system design hierarchy, the term "system" refers to the composition of units at a particular hierarchy level, where details of the units are hidden. Therefore, at a particular level in a configurable hardware system design hierarchy, units are indivisible components. However, at lower hierarchy levels, the units from a higher level have their details and internal components exposed. For example, referring to FIG. 1, at one design hierarchy level, the system 104 is viewed as a "black box" unit of a larger system, where the details about units 1–N are concealed. However, at a lower design hierarchy level, the system 104 is viewed as including units 1–N, where the unit connection details are exposed. At even lower levels of the configurable hardware system design hierarchy, the internal details of units 1–N are exposed. At the lowest hierarchy level, a unit cannot be decomposed. The generation of system 104 and units 1–N will be described in more detail below in FIG. 4.

The configuration data storage unit 105 includes configuration data 113, which hierarchically describes a configurable hardware system. For example, the configuration data 113 specifies the system and unit parameters at all relevant hierarchy levels. While the end user sets most parameters in the configuration data 113, the generation and verification unit 103 sets some parameters during the hardware integration and/or decomposition process. The configuration data 113 may be represented by any suitable electronic design automation scripting language, according to embodiments of the invention. In one embodiment of the invention, the configuration data 113 is represented in the tool control language (TCL) scripting language. In particular, the configuration data 113 may include a TCL text file defining a system design name, system-level parameters, unit-level names and parameters, unit-level connection parameters (e.g., number of wires in a signal bundle, handshaking protocols, pipelining behavior, etc.), and interface statements for binding unit instances to particular connections. In an alternative embodiment of the invention, this system information could be represented in the extensible markup language (XML) format or in a relational database.

Because multiple instances of any particular hardware unit can be included in a hardware system, each unit instance is uniquely named in the configuration data 113. Moreover, different instances of the same unit can be configured differently. For example, one instance of a FIFO may be configured to have a depth of 10 bytes, while another instance of a FIFO may be configured to have a depth of 100 bytes.

The configurable hardware library 101 describes all possible configurations of the system's hardware components. For example, the configuration hardware library 101 may describe all possible configurations of a FIFO, including its depth, width, and other configurable parameters. In one embodiment of the invention, the configurable hardware library includes hardware description language (HDL) code (e.g. Verilog or VHDL) embedded with preprocessing statements that describe how to interpret the configuration data 113.

Figure 2:
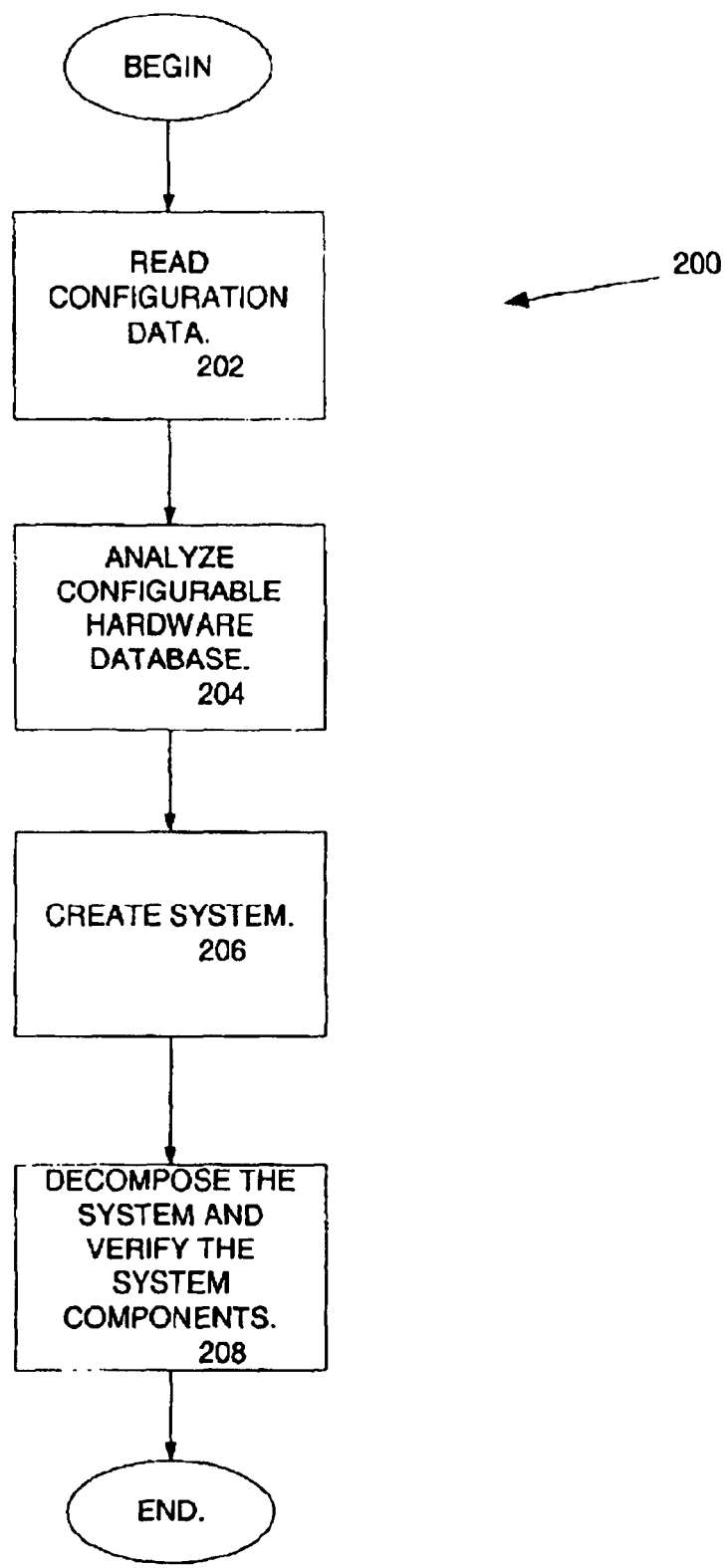
FIG. 2 is a block diagram illustrating a system for creating and verifying configurable hardware according to one embodiment of the invention.

FIG. 2 is a flow diagram illustrating the creation, decomposition, and verification of a configurable hardware system, according to embodiments of the invention. The operations of the flow diagram 200 will be described with reference to the block diagram of FIG. 1. At process block 202, the configuration data is read. For example, according to the embodiment of the invention illustrated in FIG. 1, the generation module 107 of the generation and verification unit 103 reads the configuration data 113 from the configuration data storage unit 105. As noted above, the configuration data 113 may be a TCL file that hierarchically defines a configurable hardware system. Control continues at block 204.

At block 204, the configurable hardware library is analyzed. For example, the generation module 107 analyzes the configurable hardware library 101 to determine the possible configurations of the hardware components necessary for generating the hardware system defined by the configuration data 113. Control continues at block 206.

As shown in block 206, a configurable hardware system is created. For example, the generation module 107 creates a configurable hardware system based on the configuration data 113 and the configurable hardware library 101. The operation of block 206 is further described below with reference to FIG. 3. Control continues at block 208.

At block 208, the system is decomposed and the system and its components are verified. For example, the decomposition module 109 and the verification module 111 decompose and verify the system components. The operation in block 208 will be described in more detail below in the discussion of FIG. 5.

It should be evident to one of ordinary skill in the art that the operations described in the flow diagram 200 could be repeated for generating and verifying hardware at any level in the hierarchical system design. For example, to verify a system at a particular hierarchy level, all of the system's components must be verified. This may require verifying lower level systems, which may in turn require verifying even lower level systems. Once the lowest level system is verified, the higher level systems may in turn be verified. Hence, the operations set forth in the flow diagram 200 can be repeated for creating and verifying systems and/or components at any design hierarchy level.

Figure 3:
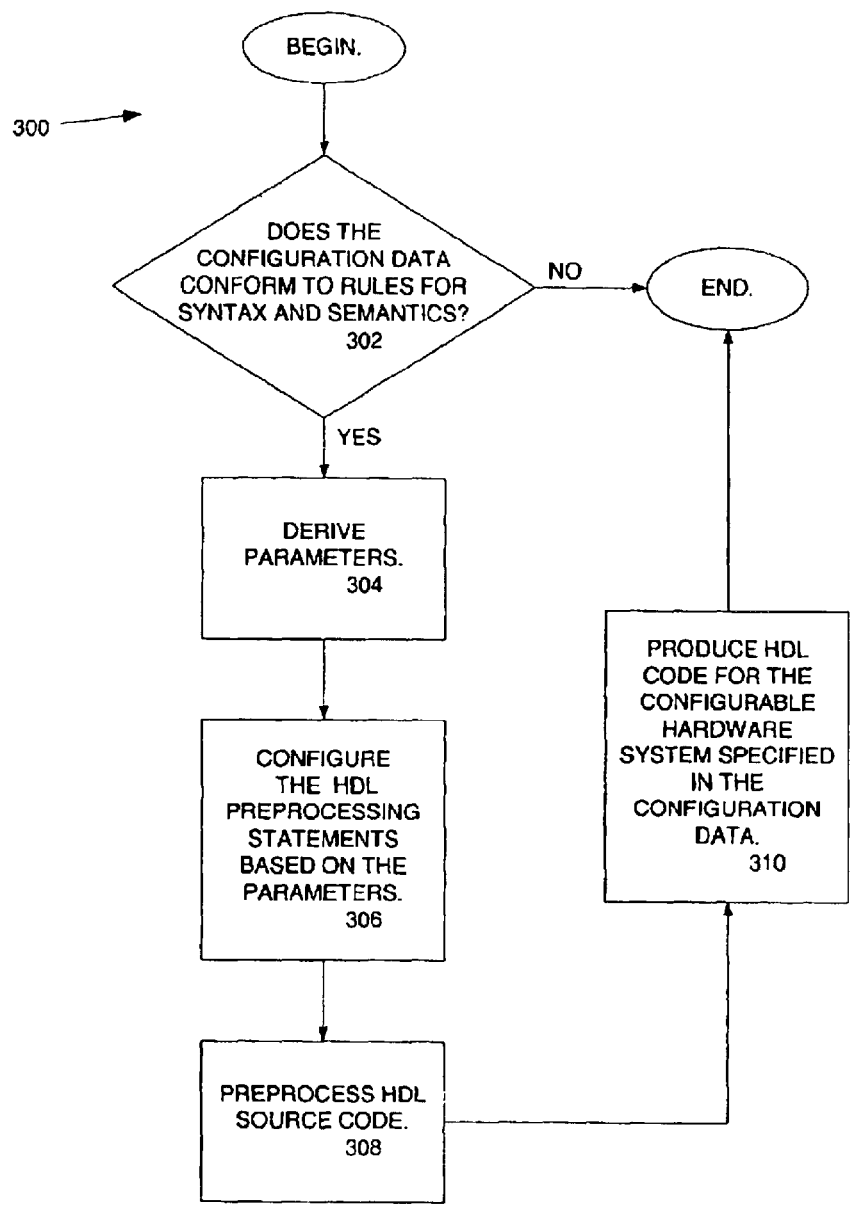
FIG. 3 is a flow diagram illustrating the creation of a system, according to embodiments of the invention.

FIG. 3 is a flow diagram illustrating the creation of a system, according to embodiments of the invention. The operations of the flow diagram 300 will be described with reference to the exemplary embodiment illustrated in FIG. 1. At decision block 302, it is determined whether the configuration data conforms to rules for syntax and semantics. For example, the integration module 109 determines whether configuration data 113 from the configuration data storage unit 105 conforms to rules for syntax and semantics. As a more specific example, in an embodiment where the configuration data 113 is represented by a TCL text file, the integration module 109 determines whether the TCL file conforms to the syntax and semantics rules of the HDL used by the configurable hardware library 101. In one embodiment, the integration module 109 employs a high-level language program (e.g., a C++, Python, or Java program) to analyze a TCL file for syntax and semantics. If the configuration data file conforms to the syntax and semantics rules, control continues at block 304. Otherwise, the flow ends with an error report. Control continues at block 304.

At block 304, parameters are derived. For example, the integration module 109 derives system parameters from the configuration data 113. As a more specific example, in one embodiment, the integration module 109 derives the system's parameters by analyzing a TCL file, which defines a configurable hardware system. For example, a system parameter may specify the minimum bandwidth required for an internal communications path. From this setting, parameters for specifying the number of wires used at various connection points in the system are derived according to the rules in the configuration data. Control continues at block 306.

As shown in block 306, the preprocessing statements are configured based on the derived parameters. For example, in one embodiment of the invention, the integration module 109 configures HDL code preprocessing statements (stored in the configurable hardware library 101) that are affected by the specified and derived parameters. In doing this, the integration module 109 may impart particular values or control structures to preprocessor statements embedded in the HDL code. Control continues at block 308.

As shown in block 308, the HDL source code is preprocessed. For example, the integration module 109 preprocesses the HDL source code that was configured according to the derived parameters. In one embodiment of the invention, the integration module 109 includes a macro language preprocessor (e.g., a C preprocessor, an M4 preprocessor, or a SIMPLE preprocessor) for preprocessing the embedded HDL source code. Control continues at block 310.

At block 310, the HDL code for the configurable hardware system specified in the configuration data is generated. For example, the integration module 109 generates the HDL code for the system specified in the configuration data 113 using HDL code from the configurable hardware library 101. From block 310, control ends.

Figure 4:
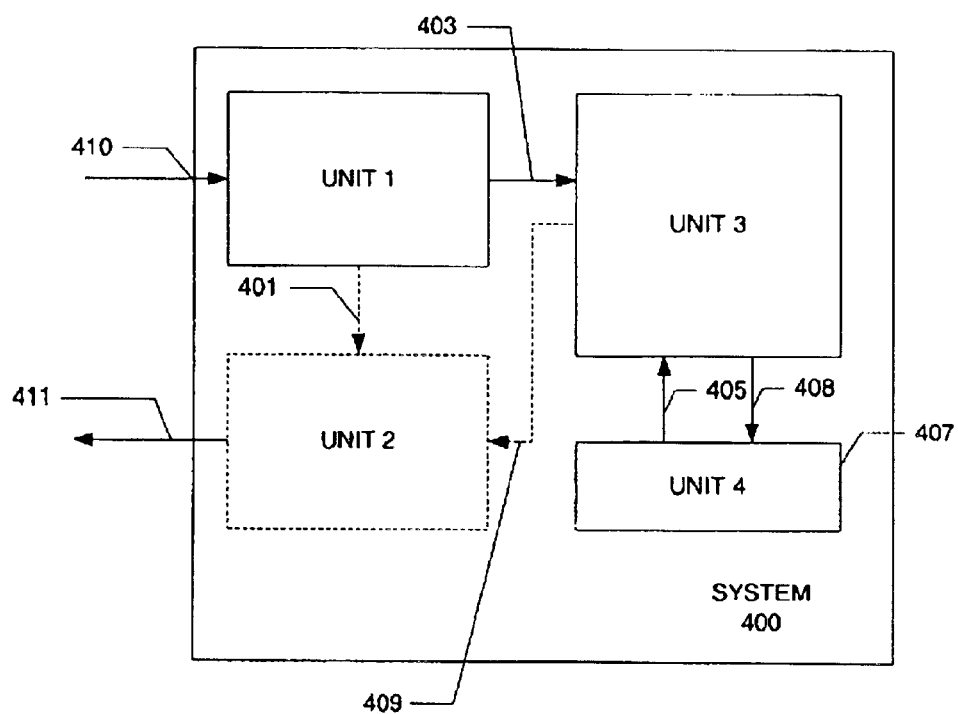
FIG. 4 is a conceptual block diagram of a system design according to embodiments of the invention.

FIG. 4 is a conceptual block diagram of a system design according to embodiments of the invention. As described above, according to an embodiment of the invention, the operations of FIG. 3 produce a system design represented in HDL code. FIG. 4 provides a graphical representation of such a system. FIG. 4 includes system 400, which includes unit 1, unit 2, unit 3, and unit 4. In system 400, unit 1 communicates to systems outside of the system 400 over a communication path 410. Unit 1 is coupled to unit 2 and unit 3 with communication paths 401 and 403, respectively. Unit 2 communicates with systems outside of system 400 through communication path 411. Unit 3 is coupled to unit 4 with communication paths 405 and 408. Unit 3 is also coupled to unit 2 with a communication path 409.

Unit 2, illustrated with broken lines, is an optional unit in the system 400. Connection paths 401 and 409 are also optional. For a given level of the system design hierarchy, a unit (or connection path) is optional when it is unknown whether factors external to the system will require the optional unit's functionality (e.g., a system at a higher level in the design hierarchy). For example, if system 400 could be configured to operate in two different modes, unit 2 would be optional if it's functionality were required by the first mode, but not by the second mode.

Figure 5:
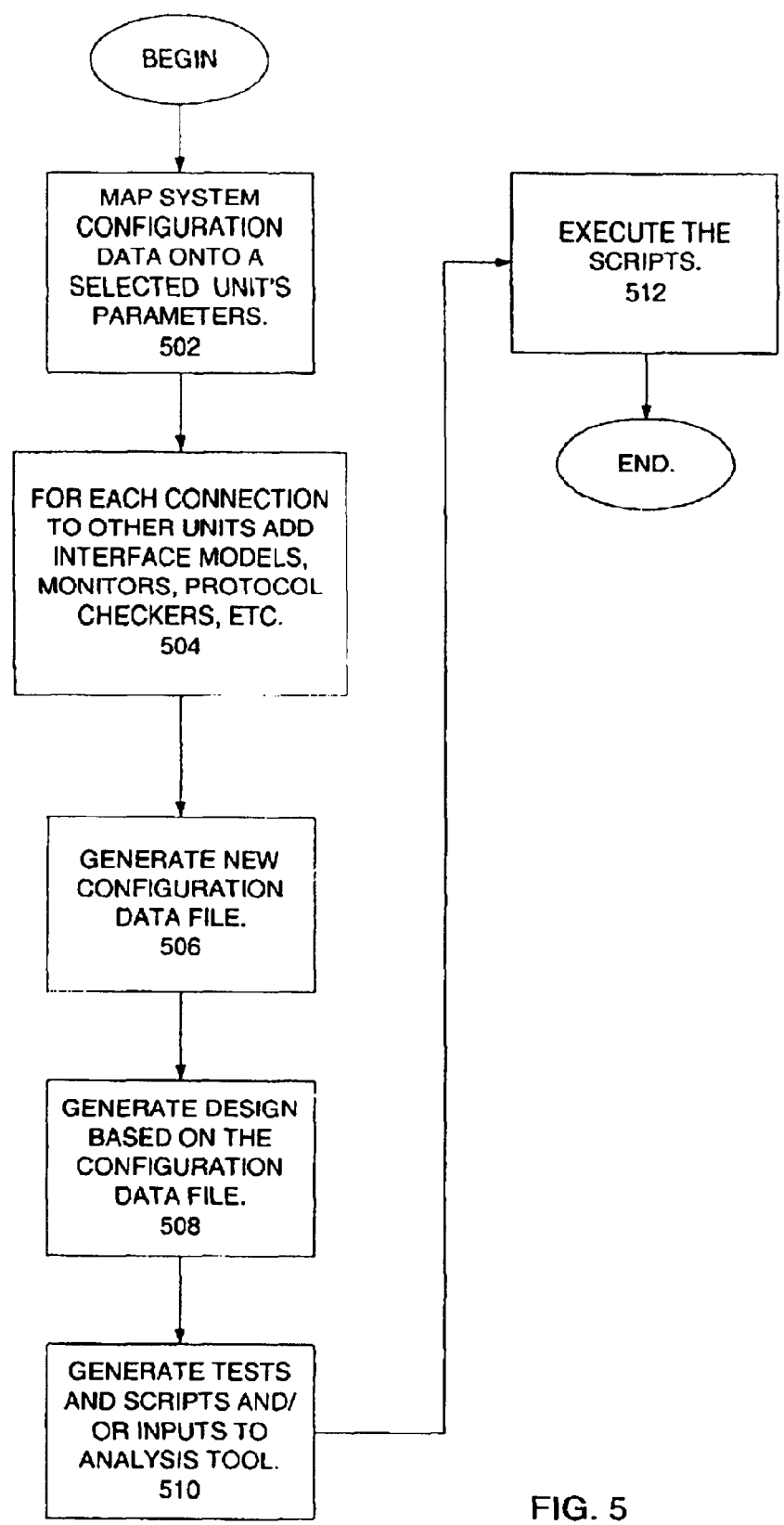
FIG. 5 is a flow diagram illustrating operations for decomposing and verifying a configurable hardware system according to embodiments of the invention.
Figure 6:
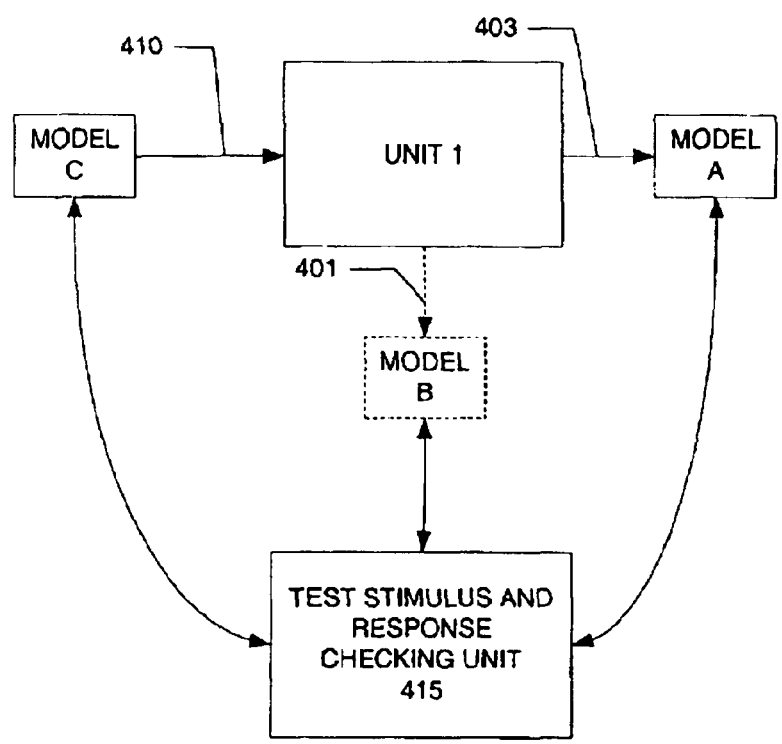
FIG. 6 is a block diagram illustrating a test-bench for verifying a unit according to embodiments of the invention.

FIGS. 5 and 6 illustrate how system 400 is decomposed and verified according to embodiments of the invention. FIG. 5 is a flow diagram illustrating operations for decomposing and verifying a configurable hardware system according to embodiments of the invention. FIG. 6 is a block diagram illustrating a test-bench for verifying a unit according to embodiments of the invention. FIGS. 5 and 6 will be described with reference to the exemplary system of FIG. 4 and the exemplary embodiment of FIG. 1.

Referring to the flow diagram of FIG. 5, at block 502, the configuration data 113 is mapped onto a selected unit's parameters. For example, the decomposition module 109 maps the configuration data 113 defining system 400 onto the parameters of a unit of system 400 (e.g., unit 1). As a more specific example, the decomposition module 109 analyzes the configuration data 113 to determine how unit 1's parameters should be configured to meet the requirements of system 400. Control continues at block 504.

At block 504, for each connection to other units, interface models, monitors, and/or protocol checkers are added to the unit. For example, the verification module 111 analyzes the configuration data 113 to determine the connections for the selected unit (e.g., unit 1). For each connection (e.g., communication path), the decomposition module 109 couples a model to the unit, which may include an interface driver model, an interface monitor, and/or a protocol checker. This operation is conceptually illustrated in FIG. 6. In FIG. 6, model A is connected to unit 1 through communication path 403, while model B is connected to unit 1 through communication path 401. Model C is connected to unit 1 through communication path 410. The test stimulus and response checking unit 415 is connected to models A, B, and C. The test stimulus and response checking unit 415 monitors and facilitates testing operations. In the test-bench, models are used for sending and receiving information to the unit being verified. For example, models A and B will receive streams of data from unit 1 according to unit 1's parameters (e.g., according to the particular communication protocol defined for the particular communication path). Similarly, model C will transmit data to unit 1 according to unit 1's parameters. The particular data to be transmitted to and from the unit will be determined by the tests used for verifying the unit. These tests will be discussed in more detail below. From block 504, control continues at block 506.

At block 506, the configuration data is generated. For example, decomposition module 109 generates configuration data 113 specifying the selected unit's parameters. According to one embodiment of the invention, the decomposition module 109 generates configuration data 113 in the form of a TCL file, as described above in the discussion of FIG. 1. According to an alternative embodiment, the decomposition module 109 generates configuration data 113 in the form of an XML file.

At block 508, a design based on the configuration data 113 is generated. For example, the generation module 107 uses the configurable hardware library 101 to generate a configurable hardware system design based on the configuration data 113. This operation is described in more detail above, in the discussion of FIG. 3. In one embodiment, the design is represented by HDL code. Control continues at block 510.

At block 510, tests and scripts and/or inputs to an analysis tool are generated. For example, the verification module 111 generates tests and scripts for running the tests and/or inputs to analysis tools. From block 510, control continues at block 512. In generating the tests, the verification module 111 may use pre-existing tests that are known to verify the functionality of a particular unit or it may generate customized tests based on an analysis of the unit configuration. These tests will exercise and verify the functionality of the configured unit being tested. According to an embodiment of the invention, the verification module 111 generates tests that are capable of verifying any configuration of the unit. In this embodiment, the tests read the configuration data 113 and modify their stimulus accordingly while the test is running, rather than before testing begins. The verification module 111 can also generate scripts for automatically performing the tests.

As an additional or alternative form of testing, the verification module 111 provides the design to an analysis tool, which performs a static analysis of the design. For example, according to one embodiment of the invention, the verification module 111 provides the unit design represented by HDL code to a static verification tool that analyzes the HDL code for errors. In one embodiment, the static verification tool generates warnings and or error messages based on its analysis of the HDL code.

As shown in block 512, the scripts are executed. For example, the verification module 111 executes the scripts, which automatically test and verify the selected unit.

It should be apparent to one of ordinary skill in the art that the operations described in the flow diagram of FIG. 5 can be repeated to verify any unit/system at any level in a design hierarchy.

Referring to FIG. 1, the generation and verification unit 103, configurable hardware library 101, and configuration data storage unit 105 may be implemented in the form of a conventional computing platform, including one or more processors, application specific integrated circuits (ASICs), memories, and/or machine readable media whereon instructions are stored for performing operations according to embodiments of the invention. Machine-readable media includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc. In one embodiment, the units shown in FIG. 1 are machine readable media executing on a processor to carryout the operations described herein. However, in alternative embodiments, the units of FIG. 1 are other types of logic (e.g., digital logic) for executing the operations described herein. Alternatively, according to one embodiment of the invention, the generation and verification unit 103, configurable hardware library 101, and configuration data storage unit 105 can include one or more separate computer systems. It should also be understood that, according to embodiments of the invention, the components illustrated in FIG. 1 could be distributed over a number of networked computers, wherein they could be remotely controlled and operated.

Figure 7:
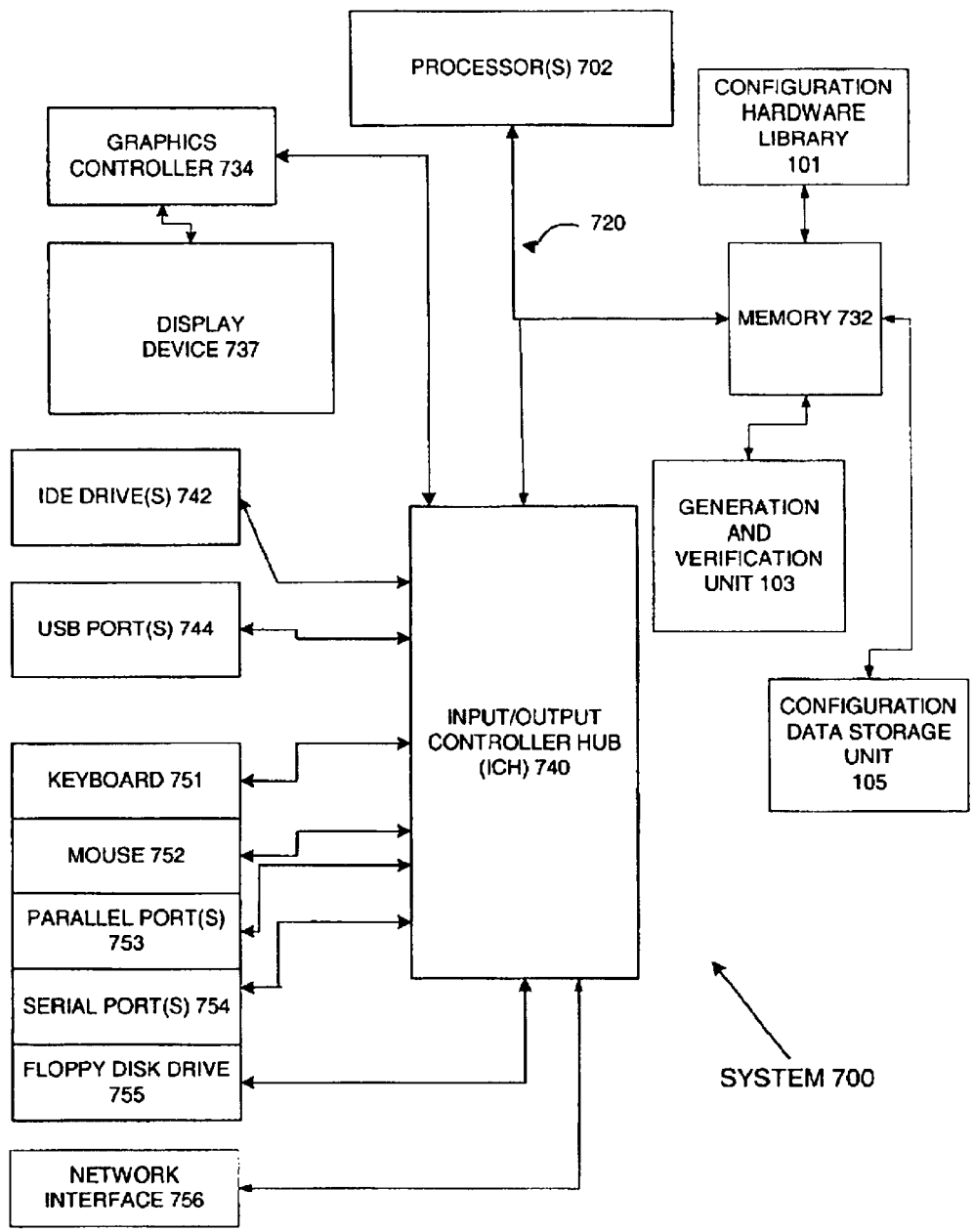
FIG. 7 illustrates an exemplary system for decomposing and verifying configurable hardware, according to embodiments of the invention.

FIG. 7 illustrates an exemplary system for decomposing and verifying configurable hardware, according to embodiments of the invention. As illustrated in FIG. 7, computer system 700 comprises processor(s) 702. Computer system 700 also includes a memory 732, processor bus 710 and input/output controller hub (ICH) 740. The processor(s) 702, memory 732 and ICH 740 are coupled to the processor bus 710. The processor(s) 702 may comprise any suitable processor architecture. For other embodiments of the invention, computer system 700 may comprise one, two, three, or more processors, any of which may execute a set of instructions that are in accordance with embodiments of the present invention.

The memory 732 stores data and/or instructions, and may comprise any suitable memory, such as a dynamic random access memory (DRAM), for example. In one embodiment of the invention, the configuration hardware library 101, generation and verification unit 103, and configuration data storage unit 105 are stored in memory 732. However, they may be stored in any or all IDE drive(s) 742, memory 732, and/or other suitable storage devices. A graphics controller 734 controls the display of information on a display device 737, according to embodiments of the invention.

The input/output controller hub (ICH) 740 provides an interface to I/O devices or peripheral components for computer system 700. The ICH 740 may comprise any suitable interface controllers to provide for any suitable communication link to the processor(s) 702, memory 732 and/or to any suitable device or component in communication with the ICH 740. For one embodiment of the invention, the ICH 740 provides suitable arbitration and buffering for each interface.

For one embodiment of the invention, the ICH 740 provides an interface to one or more suitable integrated drive electronics (IDE) drives 742, such as a hard disk drive (HDD) or compact disc read only memory (CD ROM) drive for example, to store data and/or instructions for example, one or more suitable universal serial bus (USB) devices through one or more USB ports 744. For one embodiment of the invention, the ICH 740 also provides an interface to a keyboard 751, a mouse 752, a floppy disk drive 755, one or more suitable devices through one or more parallel ports 753 (e.g., a printer), and one or more suitable devices through one or more serial ports 754. For one embodiment of the invention, the ICH 740 also provides a network interface 756 though which the computer system 700 can communicate with other computer and/or devices.

Accordingly, computer system 700 includes a machine-readable medium on which is stored a set of instructions (i.e., software) embodying any one, or all, of the methodologies described herein. For example, software can reside, completely or at least partially, within memory 732 and/or within processor(s) 702.

While the invention has been described in terms of several embodiments, those skilled in the art will recognize that the invention is not limited to the embodiments described. The method and apparatus of the invention can be practiced with modification and alteration within the spirit and scope of the appended claims. The description is thus to be regarded as illustrative instead of limiting on the invention.

We claim:

1. A computer implemented method, comprising:
   automatically decomposing a configurable hardware system into a set of one or more units;
   creating a test-bench for each of the set of units; and
   verifying each of the set of units before verifying the configurable hardware system, wherein the configurable hardware system is customized at design creation time by using specified values for a set of parameters and a first instance of the configurable hardware system is different in function than a second instance of the configurable hardware system.

2. The computer implemented method of claim 1, wherein the set of units is defined in a configurable hardware library, and wherein the configurable hardware system is specified in a configuration data storage unit.

3. The computer implemented method of claim 2, wherein the configuration data is represented in a hierarchical language and wherein the configurable hardware library is represented in hardware design language (HDL).

4. The computer implemented method of claim 1, wherein the test-benches include models attached to each unit connection, wherein the models send data to and receive data from the unit according to parameters of the unit.

5. A computer implemented method comprising:
   automatically decomposing a set of one or more units at a first level of a configurable hardware system design hierarchy, into a set of one or more units of a lowest level of the hardware system design hierarchy, wherein the configurable hardware system design hierarchy includes a set of one or more hierarchy levels; and
   individually verifying units of each hierarchy level of the hardware system design hierarchy successively from the lowest level to the first level with test benches dynamically built for each unit of each successive level, wherein the configurable hardware system is customized at a design creation time.

6. The computer implemented method of claim 5, wherein the automatically decomposing is based on configuration data and the contents of a configurable hardware library.

7. The computer implemented method of claim 6, wherein the configuration data specifies parameters for the units of each of the set of configurable hardware system design levels.

8. The computer implemented method of claim 6, wherein the configurable hardware library defines the units of each of the set of hierarchy levels.

9. A computer implemented method, comprising:
mapping a set of configuration data onto a corresponding configurable unit definition selected from a configurable hardware library to generate a set of one or more configurable hardware units;
dynamically generating a test bench for each of the set of configurable hardware units based on the configuration data;
verifying each of the set of configurable hardware units with their corresponding test bench;
integrating the verified set of configurable hardware units into a configurable hardware system; and
verifying the configurable hardware system during a functional logic verification in a design creation environment.

10. The computer implemented method of claim 9 further comprising:
generating tests to be run on the test-benches;
generating scripts for executing the tests; and
generating inputs to an analysis tool.

11. The computer implemented method of claim 9, wherein the corresponding configurable unit definition is represented in hardware design language (HDL).

12. The computer implemented method of claim 9, wherein the configuration data is represented in tool control language (TCL), and wherein said the configuration data defines parameters for each of the set of configurable hardware units.

13. The computer implemented method of claim 9 wherein the test-benches include models connected to each communication path of the unit.

14. A computer implemented method of functional logic verification, comprising:
building a set of one or more test benches for individual units decomposed from a configurable hardware system based on configuration data and a configurable hardware library, wherein the individual units are of a lower level of a configurable hardware design hierarchy, wherein the system is of a higher level of a configurable hardware design hierarchy;
building a system test-bench; and
verifying the configurable hardware system after verifying the individual units.

15. The computer implemented method of claim 14, wherein the system is verified using the system test-bench and the individual units are verified using the set of test-benches.

16. The computer implemented method of claim 14 further comprising:
generating tests to be run on the set of test-benches and the system test-bench;
generating scripts for executing the tests; and
generating inputs to an analysis tool.

17. The computer implemented method of claim 14, wherein the configurable hardware library defines the units included in the system, and wherein the configuration data specifies the parameters of the system.

18. An apparatus, comprising:
a generation and verification unit to automatically generate, decompose, and verify a configurable hardware system;
a configuration data storage unit including configuration data to define a configurable hardware system design, the configuration data storage unit coupled to the generation and verification unit; and
a configurable hardware library to store definitions of configurable hardware units for integrating and decomposing hardware systems, the configurable hardware library coupled to the generation and verification unit.

19. The apparatus of claim 18, wherein the definitions of the configurable hardware units are represented in a hardware design language (HDL).

20. The apparatus of claim 18, wherein the configuration data is represented a hierarchical language.

21. The apparatus of claim 18, wherein the generation and verification unit includes a generation module to a generate units and systems within a hardware design hierarchy, a decomposition module to decompose the units and the systems, and a verification module to build test-benches for the units and the systems and to verify the units and the systems.

22. The apparatus of claim 21 wherein the units and systems are represented in HDL.

23. A machine-readable medium that provides instructions, which when executed by a machine, cause the machine to perform operations comprising:
automatically decomposing a configurable hardware system into a set of one or more units;
creating a test-bench for each of the set of units; and
verifying each of the set of units before verifying the configurable hardware system design, wherein the configurable hardware system is customized at design creation time by using specified values for a set of parameters and a first instance of the configurable hardware system is different in function than a second instance of the configurable hardware system.

24. The machine-readable medium of claim 23, wherein the set of units is defined in a configurable hardware library, and wherein the system is specified in a configuration data storage unit.

25. The machine-readable medium of claim 24, wherein the configuration data is represented a hierarchical language and wherein the configurable hardware library is represented in hardware design language (HDL).

26. The machine-readable medium of claim 23, wherein the test-benches include models attached to each unit connection, wherein the models send data to and receive data from the unit according to parameters of the unit.

27. A machine-readable medium that provides instructions, which when executed by a machine, cause the machine to perform operations comprising:
automatically decomposing a set of one or more units at a first level of a configurable hardware system design hierarchy, into a set of one or more units of a lowest level of the hardware system design hierarchy, wherein the configurable hardware system design hierarchy includes a set of one or more hierarchy levels; and
individually verifying units of each hierarchy level of the hardware system design hierarchy successively from the lowest level to the first level with test benches dynamically built for each unit of each successive level, wherein the configurable hardware system is customized at design creation time.

28. The machine-readable medium of claim 27, wherein the automatically decomposing is based on configuration data and the contents of a configurable hardware library.

29. The machine-readable medium of claim 28, wherein the configuration data specifies parameters for the units of each of the set of configurable hardware system design levels.

30. The machine-readable medium of claim 28, wherein the configurable hardware library defines the units of each of the set of hierarchy levels.

31. A machine-readable medium that provides instructions, which when executed by a machine, cause the machine to perform operations comprising:

mapping a set of configuration data onto a corresponding configurable unit definition selected from a configurable hardware library to generate a set of one or more configurable hardware units;

dynamically generating a test bench for each of the set of configurable hardware units based on the configuration data;

verifying each of the set of configurable hardware units with their corresponding test bench;

integrating the verified set of configurable hardware units into a configurable hardware system; and verifying the configurable hardware system during a functional logic verification in a design creation environment.

32. The machine-readable medium of claim 31, further comprising:

generating tests to be run on the test-benches;

generating scripts for executing the tests; and generating inputs to an analysis tool.

33. The machine-readable medium of claim 31, wherein the corresponding configurable unit definition is represented in hardware design language (HDL).

34. The machine-readable medium of claim 31, wherein the configuration data is represented in tool control language (TCL), and wherein the configuration data defines parameters for each of the set of configurable hardware units.

35. The machine-readable medium of claim 31, wherein the test-benches include models connected to each communication path of the unit.

36. A machine-readable medium that provides instructions, which when executed by a machine, cause the machine to perform operations of functional logic verification, comprising:

building a set of one or more test benches for individual units decomposed from a configurable hardware system based on configuration data and a configurable hardware library, wherein the individual units are of a lower level of a configurable hardware design hierarchy, wherein the system is of a higher level of a configurable hardware design hierarchy;

building a system test-bench; and verifying the configurable hardware system after verifying the individual units.

37. The machine-readable medium of claim 36, wherein the system is verified using the system test-bench and the individual units are verified using the set of test-benches.

38. The machine-readable medium of claim 36 further comprising:

generating tests to be run on the set of test-benches and the system test-bench;

generating scripts for executing the tests; and generating inputs to an analysis tool.

39. The machine-readable medium of claim 36, wherein the configurable hardware library defines the units included in the system, and wherein the configuration data specifies the parameters the system.

* * * * *

US006816814C1

(12) INTER PARTES REEXAMINATION CERTIFICATE (1245th)

United States Patent
Ebert et al.

(10) Number: US 6,816,814 C1
(45) Certificate Issued: *Mar. 16, 2016

(54) METHOD AND APPARATUS FOR DECOMPOSING AND VERIFYING CONFIGURABLE HARDWARE

(75) Inventors: Jeffrey Allen Ebert, Half Moon Bay, CA (US); Ravi Venugopalan, Santa Clara, CA (US); Scott Carlton Evans, Santa Clara, CA (US)

(73) Assignee: SONICS INC, Mountain View, CA (US)

Reexamination Request:
No. 95/000,667, May 11, 2012

Reexamination Certificate for:
Patent No.: 6,816,814
Issued: Nov. 9, 2004
Appl. No.: 10/293,734
Filed: Nov. 12, 2002

(*) Notice: This patent is subject to a terminal disclaimer.

(51) Int. Cl.
*G06F 11/30* (2006.01)
*G06F 15/00* (2006.01)
*G06F 17/50* (2006.01)
*G21C 17/00* (2006.01)
*G01R 31/3183* (2006.01)
*G06F 11/26* (2006.01)

(52) U.S. Cl.
CPC ........ *G01R 31/318314* (2013.01); *G06F 11/26* (2013.01); *G06F 17/5022* (2013.01)

(58) Field of Classification Search
None
See application file for complete search history.

(56) References Cited

To view the complete listing of prior art documents cited during the proceeding for Reexamination Control Number 95/000,667, please refer to the USPTO's public Patent Application Information Retrieval (PAIR) system under the Display References tab.

*Primary Examiner* — Angela M Lie

(57) ABSTRACT

The present invention includes a method and apparatus for decomposing and verifying configurable hardware. In one embodiment, the method includes automatically decomposing a hardware system into a set of one or more units, creating a test-bench for each of the set of units, and verifying each of the set of units before verifying the hardware system design.

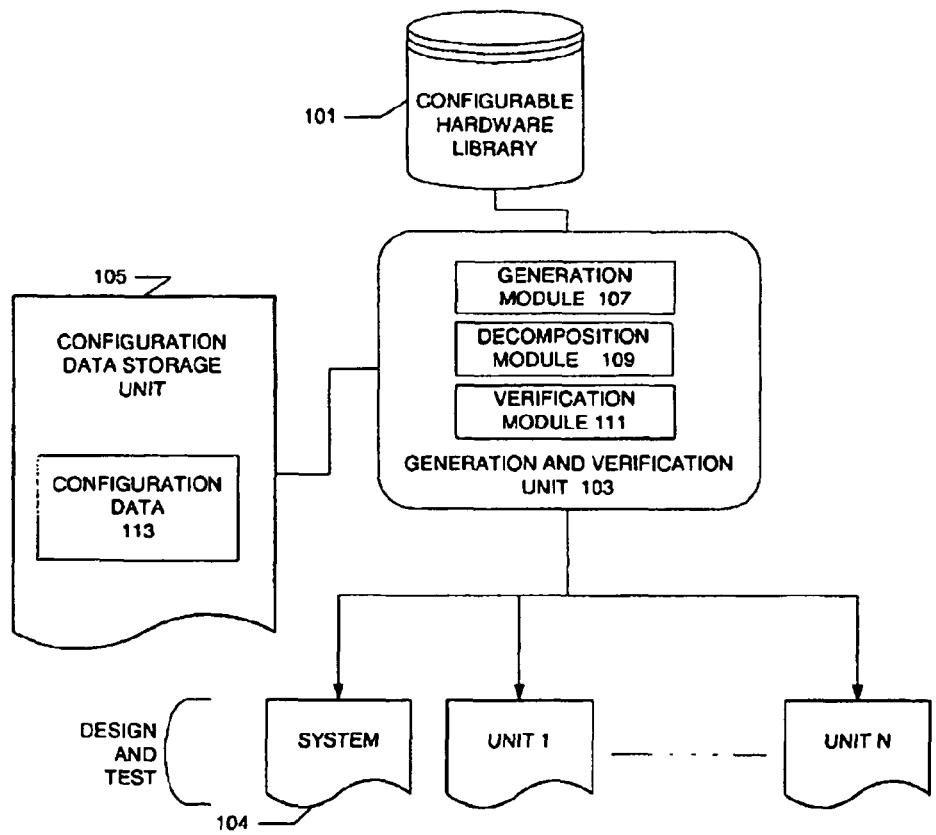

INTER PARTES REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-20 and 23-39 are cancelled.
Claims 21 and 22 were not reexamined.

* * * * *